United States Patent
Kenkare et al.

(10) Patent No.: US 7,630,272 B2
(45) Date of Patent: Dec. 8, 2009

(54) MULTIPLE PORT MEMORY WITH PRIORITIZED WORLD LINE DRIVER AND METHOD THEREOF

(75) Inventors: Prashant U. Kenkare, Austin, TX (US); Ravindraraj Ramaraju, Round Rock, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 348 days.

(21) Appl. No.: 11/676,341

(22) Filed: Feb. 19, 2007

(65) Prior Publication Data

US 2008/0198681 A1    Aug. 21, 2008

(51) Int. Cl.
*G11C 8/00* (2006.01)
*G11C 7/00* (2006.01)

(52) U.S. Cl. .................. 365/230.05; 365/191; 365/195; 365/230.06; 365/230.08; 365/233.1

(58) Field of Classification Search ............ 365/230.05, 365/230.06, 230.08, 191, 195, 233.1
See application file for complete search history.

(56) References Cited

U.S. PATENT DOCUMENTS

| 5,276,842 | A |   | 1/1994 | Sugita |             |
|-----------|---|---|--------|--------|-------------|
| 5,289,427 | A | * | 2/1994 | Nicholes et al. | 365/230.05 |
| 5,434,818 | A |   | 7/1995 | Byers et al. |        |
| 5,541,887 | A | * | 7/1996 | Dhong et al. | 365/230.05 |
| 5,657,291 | A | * | 8/1997 | Podlesny et al. | 365/230.05 |
| 6,078,527 | A | * | 6/2000 | Roth et al. | 365/189.04 |
| 6,151,266 | A | * | 11/2000 | Henkels et al. | 365/230.06 |
| 6,169,700 | B1 | * | 1/2001 | Luo | 365/230.05 |

* cited by examiner

*Primary Examiner*—Ly D Pham
(74) *Attorney, Agent, or Firm*—Robert L. King; Daniel D. Hill

(57) ABSTRACT

A multiple port memory has a word line driver that provides a word line signal to access a first write port of a multiple port memory cell in an array of multiple port memory cells during a write operation. A first logic circuit has a first input for receiving a first port selection signal, a second input for receiving a disable signal, and an output. A buffer circuit has an input coupled to the output of the first logic circuit, and an output for providing the word line signal. The disable signal is asserted to prevent the word line driver from accessing the first write port when a second write port of the multiple port memory cell is accessed during the write operation and the second write port has a higher priority than the first write port.

17 Claims, 4 Drawing Sheets

US 7,630,272 B2

MULTIPLE PORT MEMORY WITH PRIORITIZED WORLD LINE DRIVER AND METHOD THEREOF

BACKGROUND

1. Field

This disclosure relates generally to semiconductors, and more specifically, to semiconductor data storage devices and methods of data storage.

2. Related Art

A category of semiconductor memories has two or more input/output (I/O) terminals or ports and is known as a multiple port (multi-port) memory. Memories are typically implemented in arrays of intersecting columns and rows. A memory storage circuit for storing a single data bit is provided at each intersection. When data from two or more of the ports is to be written to the memory at the same time, several problems exist. In particular, if two or more write word lines in a memory array are enabled by two or more separate port inputs to write to the same memory cell, the data being coupled from each port may have an opposite bit value and create an indeterminate or incorrect data value at the input of the memory cell. Additionally, this data contention event consumes additional power and is inefficient. Further, the continual switching of the bit line enabling transistors when higher power is being consumed is detrimental to the integrity of the bit line enabling transistors. In particular, the gate oxides of the transistors are modified by higher current flow and exhibit different electrical parameters.

Others have recognized the detrimental effects of data write contentions in a multiple port memory. A proposed solution to avoid the concurrent writing of data to a same memory cell from differing memory ports is to use comparators in the addressing decoding circuitry to compare addresses from each port with all other ports. If the same address from different ports is detected, a determination is made as to which address to permit and all others are serviced later. This determination is typically made by using an arbitration logic circuit that arbitrates which address should be permitted to write to the memory cell. Thus, an address collision is detected prior to performing a write access. When multiple port memories are implemented, a large number of comparison operations must be implemented. In addition to the size and power that is consumed by this circuitry, the comparison operations represent a significant amount of a memory cycle as measured by contemporary memory clocking speeds. Thus the known multi-port memories frequently are slowed by the address decoding circuitry functioning to detect data write contentions to a same memory cell.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
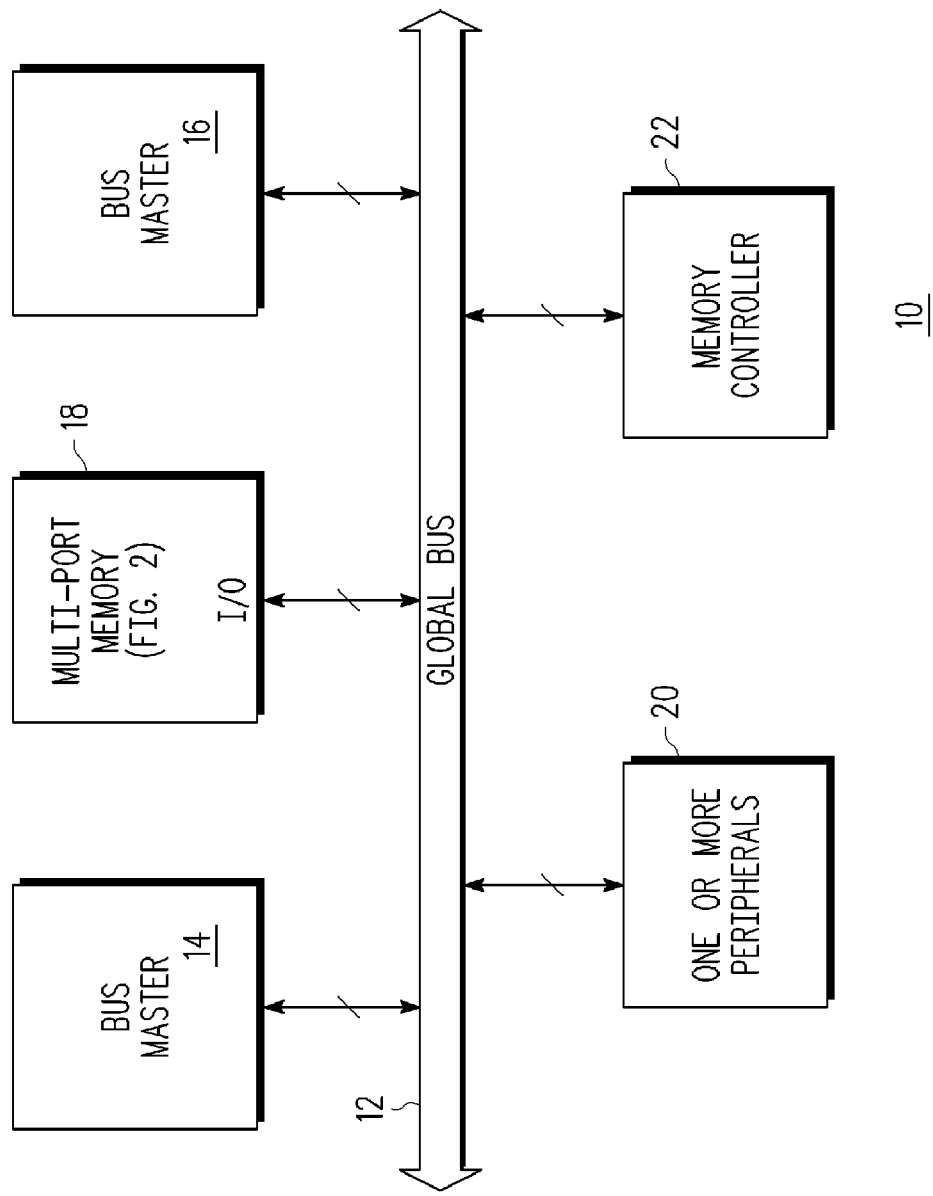
FIG. 1 illustrates in block diagram form a memory system in accordance with one form of the present invention.

Illustrated in FIG. 1 is a data processing system 10 having a global bus 12. It should be understood that data processing system 10 is only one of numerous memory architectures that may be used with the word line driver described herein. A first bus master 14 has an input/output terminal connected to the global bus 12 via a multiple-conductor bus. A second bus master 16 has an input/output terminal connected to the global bus 12 via another multiple-conductor bus. A multi-port memory 18 is connected to the global bus 12 via a local I/O bus to one or more I/O terminals or nodes. In the illustrated form the I/O bus is a multiple-conductor bus. In one example, the I/O bus has multiple write port address inputs, multiple write port data inputs, at least one read port address input and at least one data port output corresponding to the at least one read port address input. For convenience of illustration these multiple inputs are generally illustrated in FIG. 1 as "I/O". One or more peripherals 20 are connected to the global bus 12 by another multiple-conductor bus. A memory controller 22 is connected to the global bus 12 by another multiple-conductor bus.

In operation, the multi-port memory 18 is a shared resource to the rest of the data processing system 10 under control of the memory controller 22. For example, each of bus master 14 and bus master 16 may access the multi-port memory 18 at the same time and independent of each other as long as both are not trying to access a same memory cell at the same time. Various peripheral devices such as a monitor, a keyboard, a printer, etc. may be implemented within the one or more peripherals 20. The data processing system may be implemented as a desktop processing system at a board level or may be implemented all within a single integrated circuit as a system on a chip (SOC) implementation. The bus masters 14 and 16 may be implemented as any type of processor or processing element. The memory controller functions to control the access and timing of accesses to the multi-port memory 18 within data processing system 10 except for the additional access control to be detailed below.

Figure 2:
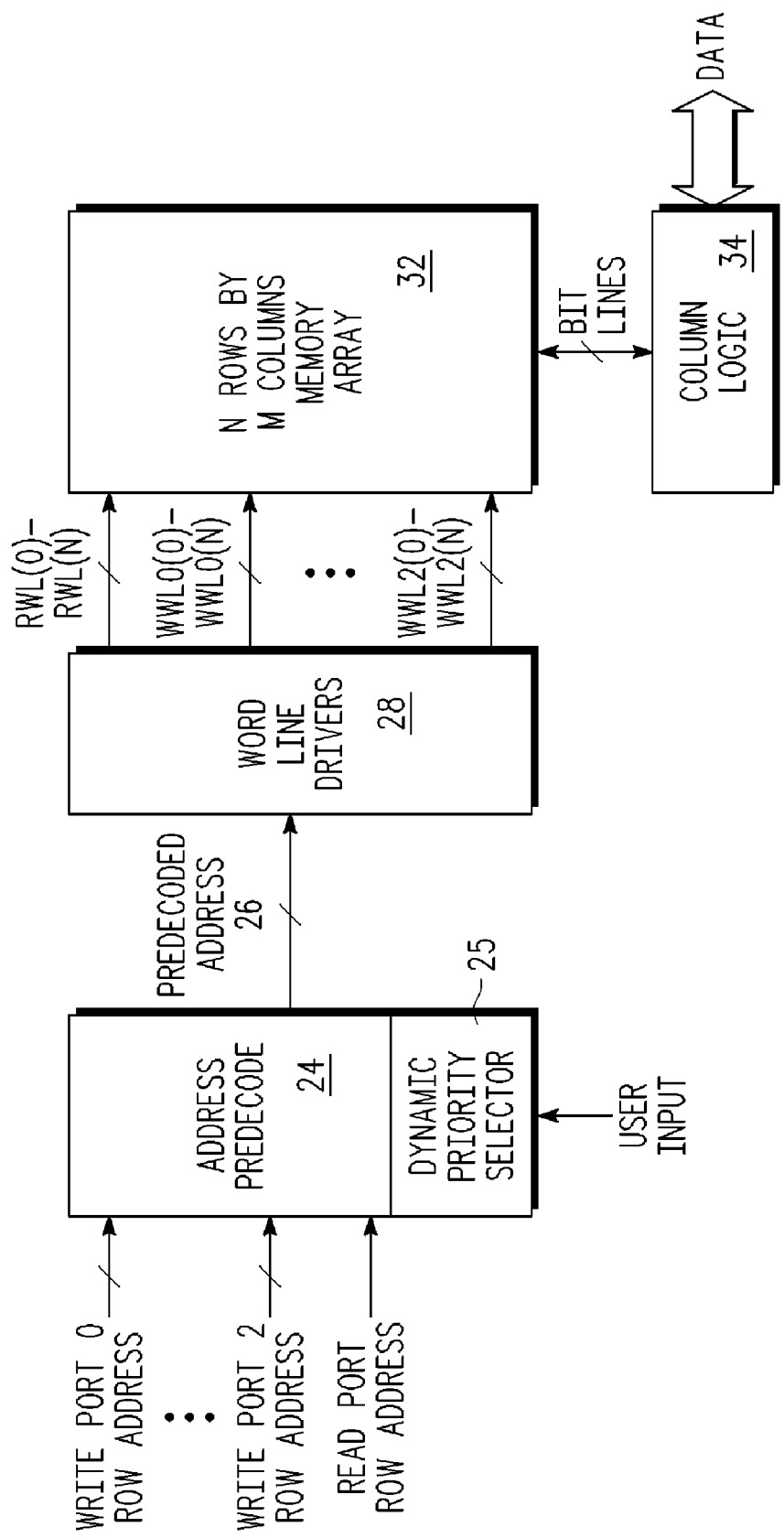
FIG. 2 illustrates in block diagram form the multiple port memory of the memory system of FIG. 1.

Illustrated in FIG. 2 is further detail of the multi-port memory 18 of FIG. 1. In this example, the memory array 32 has one read port and three write ports. In particular, an address predecode circuit 24 has multiple address inputs. Each of the address inputs is correlated with a predetermined one of the ports of multi-port memory 18. For example, a first input of the address predecode circuit 24 receives the Write Port 0 row address. Another input of the address predecode circuit 24 receives the Write Port 2 row address. An input (not shown) of the address predecode circuit 24 receives the Write Port 1 row address. There is an additional input to the address predecode circuit 24 for the read port row address. Therefore, the address predecode circuit 24 has a row address input coupled to each row address. An output of the address predecode circuit 24 provides one of a plurality of predecoded addresses 26 via a multiple conductor bus connected to an input of a plurality of word line drivers 28. The address predecode circuit 24 also has a dynamic priority selector 25 having an input for receiving a signal labeled "User Input". An output of the word line drivers 28 provides a plurality of read word line outputs, one for each port of the multi-port memory 18. In particular, word line drivers 28 provide read word line signals RWL(0) through RWL(N) where N is the number of storage cell rows in multi-port memory 18. In the illustrated form, the multi-port memory is implemented having M columns of storage cells. The number of rows and columns is implementation specific and is dependent upon storage requirements. Word line drivers 28 also provide write word line signals WWL0(0) through WWL0(N) in connection with Port 0. In connection with Port 2, word line drivers 28 provide write word line signals WWL2(0) through WWL2(N). As indicated by the intervening dots of FIG. 2 the word line driver 28 also provide write word line signals for Port 1. A memory array 32 is provided having the N rows and M columns discussed above. Memory array 32 has a first input connected to a multiple-bit conductor for receiving read word line signals RWL(0) through RWL(N). Memory array 32 has a second input connected to a multiple-bit conductor for receiving write word line signals WWL0(0) through WWL0(N). Memory array 32 has a third input connected to a multiple-bit conductor for receiving write word line signals WWL2(0) through WWL2(N). As indicated by the intervening dots of FIG. 2 the memory array 32 also has an input (not shown) for receiving write word line signals for Port 1. A plurality of bit lines is connected from a column logic 34 to an input/output terminal of memory array 32 via a multiple conductor bus. The column logic 34 has an input/output terminal for receiving and providing data to one of the ports of multi-port memory 18 and the global bus 12.

In operation, the address predecode circuit 24 provides predecoded addresses 26 in response to receiving one or more addresses at any of the memory write ports 0 through 2. An AND logic function (not shown) converts either a portion or all address bits into predecoded terms which form one of the predecoded addresses 26. In one implementation the number N is sixty-four. With sixty-four rows, the rows can be addressed using a total of six address bits. In one form three of the address bits are logically processed to create eight predecode terms PDX0 through PDX7 where X represents a first grouping of the six address bits. The remaining three address bits are logically processed to create eight predecode terms PDY0 through PDY7 where Y represents a second grouping of the six address bits. In one form the logic processing involves an ANDing of either true or inverted values of these bits. It should be appreciated that for other implementations of N, the number of predecode terms differ as well as the potential groupings. The predecode hardware is repeated for each write port that is implemented in the multi-port memory 18.

The predecoded addresses are processed by word line drivers 28 to create N write word lines for each port. For example, write port 0 uses write word lines WWL0(0) through WWL0(N) where N is 63 for a sixty-four row implementation. Similarly, write port 2 uses write word lines WWL2(0) through WWL2(N). As shown by the dots of FIG. 2 additional write word lines are generated for any additional port. The word line drivers 28 contain circuitry for ensuring that no more than one write word line is asserted for the same row regardless of how many ports are attempting to address that row. It should be noted that no prior determination is made of the row addresses to determine whether there is an interlock or collision situation where at least two addresses are addressing the same row. Additionally there are read word line drivers that function in a conventional manner and therefore will not be discussed in further detail. Memory array 32 is formed of an array of memory bit cells which function in a conventional manner upon being addressed. It should be noted that in one form the column logic 34 functions to receive one or more column addresses from one or more of the read or write ports and communicates data to and from the respective port that is providing a column address. This communication between column logic 34 and memory array 32 occurs via a plurality of bit lines. In other forms, neither read nor write addresses are directly coupled to the column logic 34. In such forms, all columns are either read or written for all ports.

Figure 3:
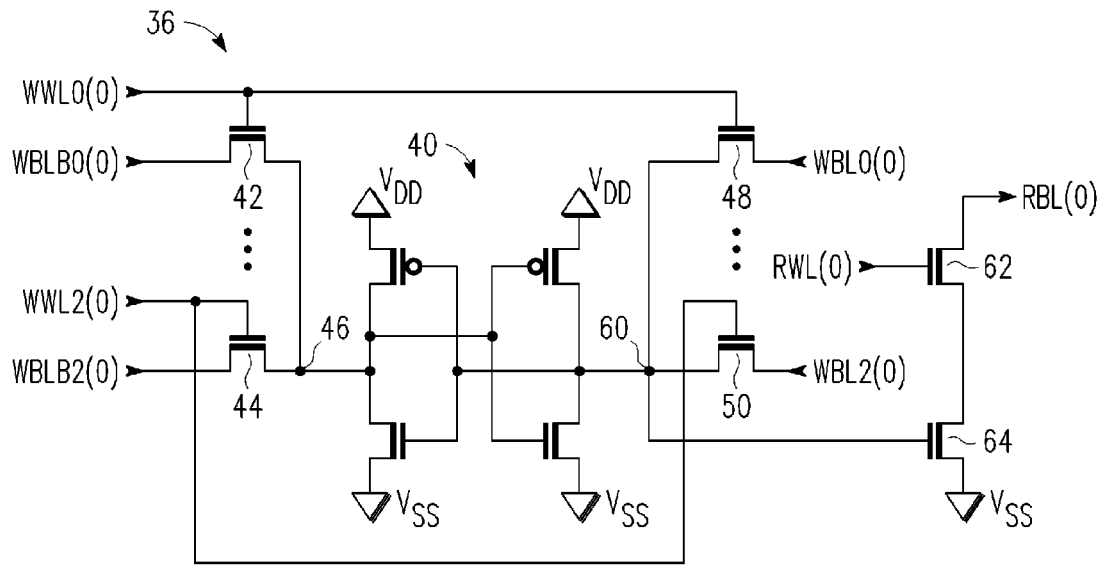
FIG. 3 illustrates in schematic form a memory cell of the memory array of the multiple port memory of FIG. 2.

Illustrated in FIG. 3 is a schematic of a memory cell 36 which may represent one form of the memory cells within the memory array 32. A write word line signal for the zero row from port 0, WWL0(0) is connected to a gate of an N-channel transistor 42 and to a gate of an N-channel transistor 48. A source of transistor 42 is connected to a complementary write bit line signal for the zero column from port 0, WBLB0(0). A drain of transistor 42 is connected to a storage node 46. A source of transistor 48 is connected to a write bit line signal for the zero column from port 0, WBL0(0). A drain of transistor 48 is connected to a storage node 60. A write word line signal for the zero row from port 2, WWL2(0), is connected to a gate of an N-channel transistor 44 and to a gate of an N-channel transistor 50. A source of transistor 44 is connected to a complement of a write bit line for the zero column from port 2, WBLB2(0). A drain of transistor 44 is connected to storage node 46. A source of transistor 50 is connected to a write bit line for the zero column from port 2, WBL2(0). A drain of transistor 50 is connected to storage node 60. A latch circuit 40 has a first input connected to storage node 46 and a second input connected to storage node 60. The latch circuit 40 is formed by two series-connected inverter circuits and is connected between a positive $V_{DD}$ power supply terminal and a negative $V_{SS}$ power supply terminal. A drain of an N-channel transistor 62 is connected to a read bit line for the zero column, RBL(0). A gate of transistor 62 is connected to a read word line for the zero row, RWL(0). A drain of transistor 62 is connected to a drain of an N-channel transistor 64. A source of transistor 64 is connected to a power supply terminal $V_{SS}$.

In operation, the memory cell 36 receives only one active write word line from the word line drivers 28. For example, if port 0 addresses memory cell 36 for writing, transistors 42 and 48 will be conductive and transistors 44 and 50 will be nonconductive. In this operating condition, the data that is present on the write bit lines WBLB0(0) and WBL0(0) is transferred to storage node 46 and storage node 60, respectively.

Figure 4:
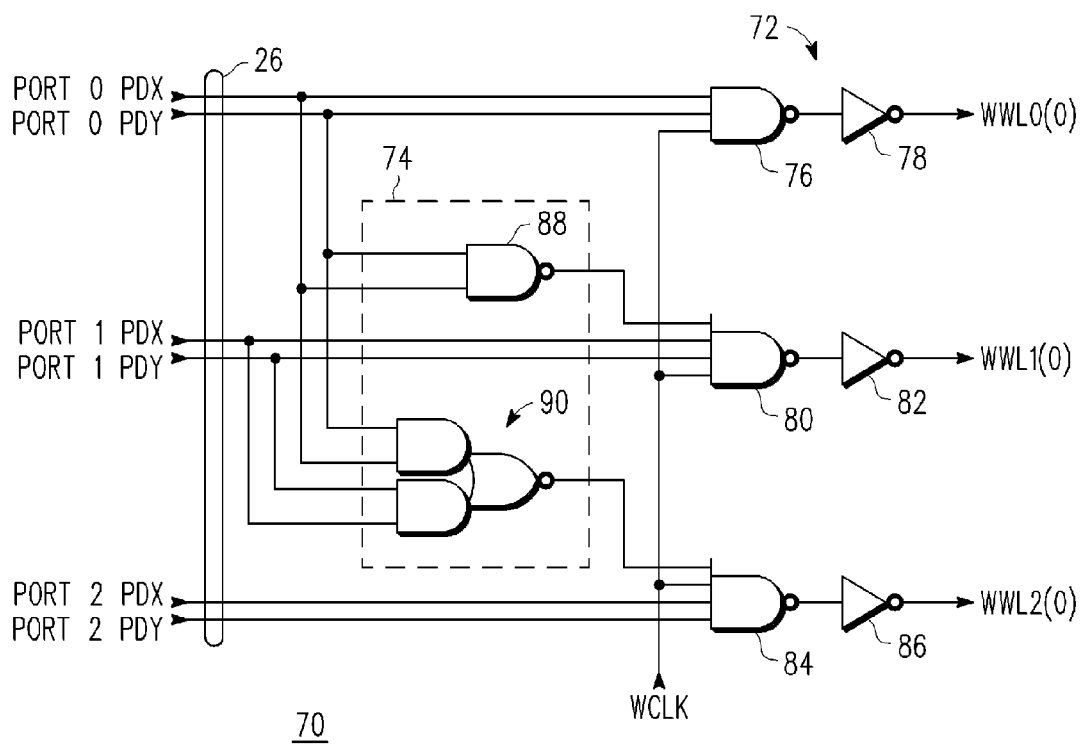
FIG. 4 illustrates in logic diagram form one embodiment of a word line driver in accordance with the present invention.

Illustrated in FIG. 4 is a schematic diagram of a word line driver 70 that is a portion of the word line drivers 28 of FIG. 2. The individual signals of predecoded addresses 26 are illustrated. The word line driver 70 generally has a driver section 72 and a disable section 74 for selectively disabling a portion of the driver section 72. A first predecode term X for port 0, Port 0 PDX, is connected to a first input of a NAND gate 76. A second predecode term Y for port 0, Port 0 PDY, is connected to a second input of NAND gate 76. A write clock enable signal, WCLK, is connected to a third input of NAND gate 76. An output of NAND gate 76 is connected to an input of an inverter 78. An output of inverter 78 provides the write word line signal for the zero row associated with Port 0 labeled WWL0(0). Driver section also has NAND gates 80 and 84 and inverters 82 and 86. Within disable section 74 is a NAND gate 88 having a first input connected to the Port 0 PDX predecode term. A second input of NAND gate 88 is connected to the Port 0 PDY predecode term. An output of NAND gate 88 is connected to a first input of NAND gate 80. A first input of a complex gate 90 is connected to the Port 0 PDX predecode term. A second input of the complex gate 90 is connected to the Port 0 PDY predecode term. A third input of the complex gate 90 is connected to the Port 1 PDX predecode term, and a fourth input of the complex gate 90 is connected to the Port 1 PDY predecode term. A second input of the NAND gate 80 is connected to the Port 1 PDX predecode term. A third input of NAND gate 80 is connected to the Port 1 PDY predecode term. A fourth input of NAND gate 80 is connected to the write clock signal WCLK. A first input of NAND gate 84 is connected to an output of the complex gate 90. A second input of NAND gate 84 is connected to the write clock signal WCLK. A third input of NAND gate 84 is connected to a first predecode term PDX for port two labeled Port 2 PDX. A fourth input of NAND gate 84 is connected to a second predecode term PDY for port two labeled Port 2 PDY. An output of NAND gate 80 is connected to an input of an inverter 82. An output of inverter 82 provides a write word line signal for row 0 from port 1, WWL1(0). An output of NAND gate 84 is connected to an input of an inverter 86. An output of inverter 86 provides a write word line signal for row 0 from port 2, WWL2(0). It should be noted that other logic implementations can readily be derived to obtain the function that is described herein.

In operation, the implementation shown has three prioritized write word lines associated with three ports each trying to address row 0 in which the highest priority is given to WWL0(0). The next highest priority is given to the write word line signal WWL1(0). The least priority is given to the write word line signal WWL2(0). Write word line WWL0(0) is asserted when both predecode terms Port 0 PDX and Port 0 PDY are true. The output of NAND gate 88 and the output of complex gate 90 are both de-asserted which forces WWL1(0) and WWL2(0) to also be de-asserted irrespective of the value of all other port predecode signals. Signal WWL1(0) is asserted only when both Port 1 PDX and Port 1 PDY are asserted and WWL0(0) is de-asserted. Signal WWL2(0) is asserted only when both Port 2 PDX and Port 2 PDY are asserted and neither of WWL1(0) and WWL0(0) are asserted.

Another feature regarding the priority assigned to the port predecode signals is provided by the dynamic priority selector 25 illustrated in FIG. 2. A user input, either in hardware or software, functions to dynamically set the desired priority among the predecoded addresses. The dynamic priority selector changes the assignment of predecoded addresses 26 relative to incoming port addresses. In one implementation this is achieved by incorporating a multiplexing (not shown) function to the predecoded addresses prior to receipt by the word line drivers. Numerous implementations of this feature are readily available.

Figure 5:
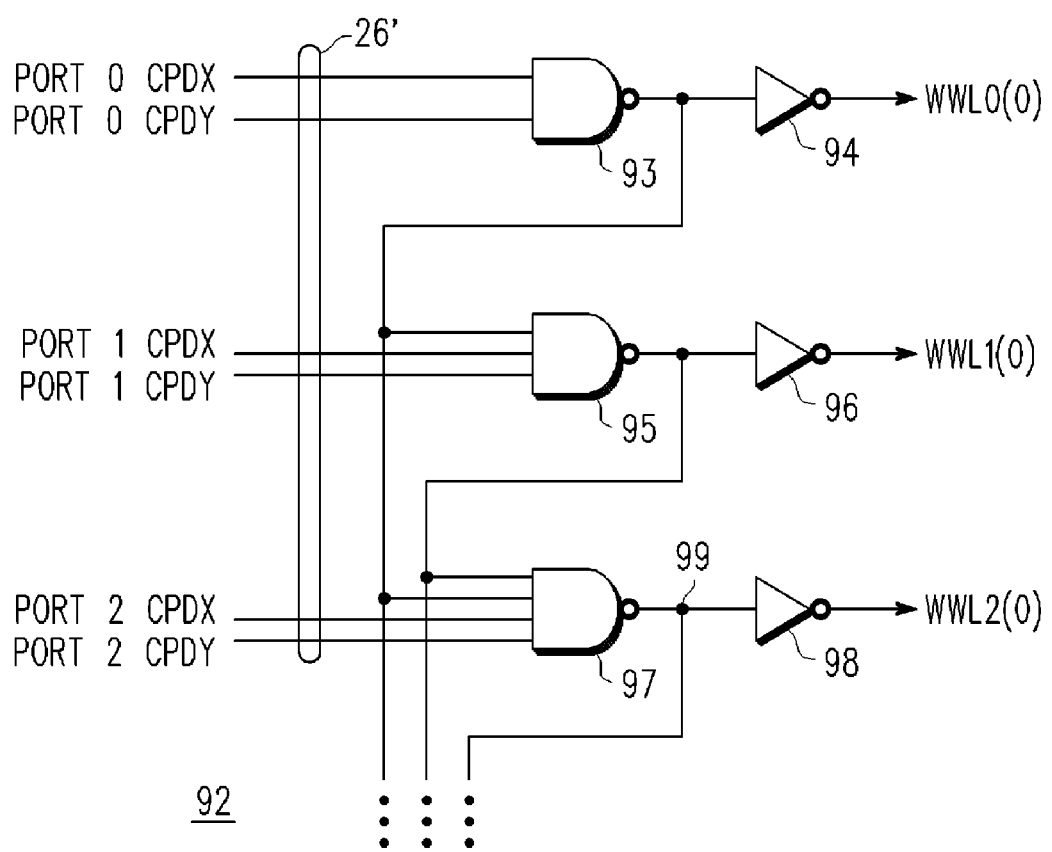
FIG. 5 illustrates in logic diagram form another embodiment of a word line driver in accordance with the present invention.

Illustrated in FIG. 5 is an alternate form of the word line driver circuit in accordance with the present invention. A word line driver 92 receives a plurality of predecoded address signals 26' which are different from the predecoded addresses 26 because predecoded address signals 26' are clocked signals. A first input of a NAND gate 93 is connected to a first clocked predecode term from port 0 labeled Port 0 CPDX. A second input of NAND gate 93 is connected to a second clocked predecode term from port 0 labeled Port 0 CPDY. The output of NAND gate 93 is connected to an input of an inverter 94, a first input of a NAND gate 95 and a first input of a NAND gate 97. An output of inverter 94 provides a write word line signal for row 0 from port 0 labeled WWL0(0). A second input of NAND gate 95 is connected to a first clocked predecode term from port 1 labeled Port 1 CPDX. A third input of NAND gate 95 is connected to a second clocked predecode term from port 1 labeled Port 1 CPDY. The output of NAND gate 95 is connected to both an input of an inverter 96 and to a second input of a NAND gate 97. An output of inverter 96 provides a write line signal for row 0 from port 1 labeled WWL1(0). A third input of NAND gate 97 is connected to a first clocked predecode term from port 2 labeled Port 2 CPDX. A fourth input of NAND gate 97 is connected to a second clocked predecode term from port 2 labeled Port 2 CPDY. An output of NAND gate 97 is connected to an input of an inverter 98 for providing a word line signal for row 2 from port 0 labeled WWL2(0). If additional ports are implemented, additional NAND gates, such as NAND gates 93, 95 and 97, are provided in a similar manner as indicated with the three continuing dots in FIG. 5.

In operation, the implementation shown has three prioritized write word lines associated with three ports each trying to address row 0 in which the highest priority is given to WWL0(0). The next highest priority is given to the write word line signal WWL1(0). The least priority is given to the write word line signal WWL2(0). Write word line WWL0(0) is asserted when both predecode terms Port 0 CPDX and Port 0 CPDY are true. The output of NAND gate 93 functions to de-assert NAND gate 95 and NAND gate 97 thereby disabling WWL1(0) and WWL2(0) irrespective of the logic values for Port 1 CPDX, Port 1 CPDY, Port 2 CPDX and Port 2 CPDY. Similarly, the output of NAND gate 95 functions to de-assert NAND gate 97 and disable WWL2(0) irrespective of the logic values for Port 2 CPDX and Port 2 CPDY. Signal WWL1(0) is asserted only when both Port 1 CPDX and Port 1 CPDY are asserted and WWL0(0) is de-asserted. Signal WWL2(0) is asserted only when both Port 2 CPDX and Port 2 CPDY are asserted and neither of WWL1(0) and WWL0(0) are asserted.

By now it should be appreciated that there has been provided a write word line driver circuit for a memory or data storage circuit that has multiple write ports. The embodiments described herein ensure that data contention does not occur from the concurrent writing through multiple write ports of the same memory cell. Thus there is an improvement in the speed, size, and cost of the circuit that avoids write address collisions in a memory. Although the embodiments described herein are in the context of a multiple master system, it should be well understood that the write word line driver features described herein apply to stand-alone memory circuits as well as memories of any size that are embedded into a processing system. The method described herein does not require a full-address comparison between each write-port address of a multi-port memory. By generating predecode terms for each address, the predecode terms are used by word line drivers without implementing full-address comparison. Therefore, multiple stages of logic circuitry that would be required to implement such comparisons are eliminated.

Although the invention has been described with respect to specific conductivity types or polarity of potentials, skilled artisans appreciated that conductivity types and polarities of potentials may be reversed. Moreover, terms such as "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, various types of transistor memory storage cell circuits may be implemented and various types of memory, such as DRAM, SRAM and MRAM (magnetoresistive random access memory) may be used. Various logic gates that implement logic functions may be implemented to perform the described functionality. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In one form there is herein provided a multiple port memory having a word line driver for providing a word line signal to access a first write port of a multiple port memory cell in an array of multiple port memory cells during a write operation. The word line driver circuit has a first logic circuit having a first input for receiving a first port selection signal, a second input for receiving a disable signal, and an output. A buffer circuit has an input coupled to the output of the first logic circuit, and an output for providing the word line signal. The disable signal is asserted to prevent the word line driver from accessing the first write port when a second write port of the multiple port memory cell is accessed during the write operation and the second write port has a higher priority than the first write port.

In another form the first port selection signal is a clocked signal. The first logic circuit has a first logic gate having a first input for receiving the first port selection signal, a second input for receiving the disable signal, and an output coupled to the first write port. A second logic gate has an output connected to the second input of the first logic gate for providing the disable signal and to the second write port. The second logic gate has an input for receiving a clocked second port selection signal during the write operation that accesses the second write port and disables access to the first write port thereby establishing a higher priority to access the second write port than the first write port.

In another form the word line driver further includes a disable circuit having an input coupled to receive at least one port selection signal of a plurality of port selection signals, and an output coupled to the second input of the first logic circuit to provide the disable signal. In yet another form the disable circuit comprises a logic gate having an input for receiving the at least one port selection signal, and an output for providing the disable signal. In another form the at least one port selection signal is received from a row address predecoder circuit. In a further form the logic gate is one of either a NAND logic function or an AND-OR-INVERT logic function. In another form a second word line driver is provided wherein the second word line driver has a second logic circuit having a first input for receiving a second port selection signal, and an output for providing the disable signal. In another form the multiple port memory cell has first and second storage nodes coupled to a pair of cross-coupled inverters. The first and second storage nodes are coupled to a first bit line pair in response to a first word line signal, and the first and second storage nodes are coupled to a second bit line pair in response to a second word line signal. In yet another form the multiple port memory of further includes a dynamic priority selector for determining which of the first and second write ports has a higher priority in response to a user input.

In another form a multiple port memory has a memory cell array having a plurality of multiple port memory cells. A multiple port memory cell of the plurality of multiple port memory cells is coupled to at least two write word lines. A plurality of word line drivers is provided. Each of the plurality of word line drivers provides a word line signal to access a predetermined port of a predetermined memory cell of the plurality of multiple port memory cells. A word line driver of the plurality of word line drivers has a first logic circuit having a first input for receiving a first port selection signal, a second input for receiving a disable signal, and an output. Within the word line driver is a buffer circuit having an input coupled to the output of the first logic circuit, and an output for providing the word line signal. The disable signal is asserted to prevent the word line driver from accessing the first write port when a second write port of the multiple port memory cell is accessed during a write operation and the second write port has a higher priority than the first write port. In one form the multiple port memory has a disable circuit having an input coupled to receive a second port selection signal, and an output coupled to the second input of the first logic circuit to provide the disable signal. In another form the disable circuit has a logic gate having an input for receiving the second port selection signal, and an output for providing the disable signal. In yet another form the multiple port memory has a row address predecoder circuit for providing the first and second port selection signals. In another form the logic gate is one of either a NAND logic function or an AND-OR-INVERT logic function. In another form there is provided a second word line driver. The second word line driver has a second logic circuit having a first input for receiving the second port selection signal, and an output for providing the disable signal. In another form the memory cell array is implemented as one of either a register file or a random access memory in a data processing system. The data processing system further has a bus and a plurality of bus masters coupled to the bus. In another form the multiple port memory has a dynamic priority selector for determining which of the first and second write ports has a higher priority in response to a user input.

In another form there is provided a method in a multiple port memory. A write operation to the multiple port memory is initiated. A first write port address is decoded to generate a first predecoded write port address to access a first write port of a predetermined memory cell. A second write port address is decoded to generate a second predecoded write port address to access a second write port of the predetermined memory cell, wherein the first and second port addresses are generated during the write operation, and wherein the first port has a higher write priority that the second port. The first predecoded port address is provided to a first word line driver. The first word line driver is coupled to provide a first word line signal to the first port. The second predecoded port address is provided to a second word line driver. The second word line driver is coupled to provide a second word line signal to the second port. A disable signal is generated from the first predecoded port address to prevent the second word line driver from providing the second word line signal to the second port during the write operation. In another form the disable signal is generated with the first word line driver. In yet another form the disable signal is generated by coupling an input of a disable circuit to an input of the first word line driver to receive the first predecoded address, and coupling an output of the disable circuit to an input of the second word line driver.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multiple port memory comprising a word line driver for providing a first word line signal to access a first write port of a multiple port memory cell in an array of multiple port memory cells during a write operation and a second word line signal to access a second write port, the word line driver comprising:

a first logic circuit comprising a first logic gate having a first input for receiving a clocked first port selection signal, a second input for receiving a disable signal, and an output coupled to the first write port and comprising a second logic gate having an output connected to the second input of the first logic gate for providing the disable signal and to a second write port of the multiple port memory cell, the second logic gate having an input for receiving a clocked second port selection signal during the write operation that accesses the second write port and disables access to the first write port thereby establishing a higher priority to access the second write port than the first write port;

a first buffer circuit having an input coupled to the output of the first logic gate, and an output for providing the first word line signal; and a second buffer circuit having an input coupled to the output of the second logic gate, and an output for providing the second word line signal;

wherein the disable signal is asserted to prevent the word line driver from accessing the first write port when the second write port of the multiple port memory cell is accessed during the write operation and the second write port has a higher priority than the first write port.

2. The multiple port memory of claim 1, wherein the first logic gate is a logic NAND and the second logic gate is a logic NAND.

3. The multiple port memory of claim 2, wherein the first buffer circuit is a first inverter and the second buffer circuit is a second inverter.

4. The multiple port memory of claim 3, wherein the at least one port selection signal is received from a row address predecoder circuit.

5. The multiple port memory of claim 1, wherein the first logic gate comprises an AND-OR-INVERT logic function and the second logic gate comprises an AND-OR-INVERT logic function.

6. The multiple port memory of claim 1, wherein the multiple port memory cell comprises first and second storage nodes coupled to a pair of cross-coupled inverters, the first and second storage nodes coupled to a first bit line pair in response to the first word line signal, and the first and second storage nodes coupled to a second bit line pair in response to the second word line signal.

7. The multiple port memory of claim 1, further comprising:

an address predecode circuit for receiving a plurality of write port addresses and providing predecoded addresses to the word line driver; and a dynamic priority selector circuit coupled to the address predecode circuit for determining which of the first and second write ports has a higher priority in response to a user input.

8. A multiple port memory comprising:

a memory cell array having a plurality of multiple port memory cells, a multiple port memory cell of the plurality of multiple port memory cells coupled to at least two write word lines; and a plurality of word line drivers, each of the plurality of word line drivers for providing a word line signal to access a predetermined port of a predetermined memory cell of the plurality of multiple port memory cells, each of the plurality of word line drivers comprising:

a first logic circuit having a first input for receiving a first port selection signal, a second input for receiving a disable signal, a third input for receiving a clock signal which is a write signal for enabling write operation in the multiple port, and an output; and a buffer circuit having an input coupled to the output of the first logic circuit, and an output for providing the word line signal;

wherein the disable signal is asserted to prevent the word line driver from accessing the first write port when a second write port of the multiple port memory cell is accessed during a write operation and the second write port has a higher priority than the first write port.

9. The multiple port memory of claim 8, further comprising a disable circuit having an input coupled to receive a second port selection signal, and an output coupled to the second input of the first logic circuit to provide the disable signal.

10. The multiple port memory of claim 9, wherein the disable circuit comprises a logic gate having an input for receiving the second port selection signal, and an output for providing the disable signal.

11. The multiple port memory of claim 10, further comprising a row address predecoder circuit for providing the first and second port selection signals.

12. The multiple port memory of claim 10, wherein the logic gate comprises one of either a NAND logic function or an AND-OR-INVERT logic function.

13. The multiple port memory of claim 8, wherein the memory cell away is implemented as one of either a register file or a random access memory in a data processing system, the data processing system further comprising:

a bus; and a plurality of bus masters coupled to the bus.

14. The multiple port memory of claim 8, further comprising:

an address predecode circuit for receiving a plurality of write port addresses and providing predecoded addresses to the word line driver; and a dynamic priority selector circuit coupled to the address predecode circuit for determining which of the first and second write ports has a higher priority in response to a user input.

15. A method in a multiple port memory, the method comprising:

initiating a write operation to the multiple port memory;

decoding a first write port address to generate a first clocked predecoded write port address to access a first write port of a predetermined memory cell;

decoding a second write port address to generate a second clocked predecoded write port address to access a second write port of the predetermined memory cell, wherein the first port has a higher write priority that the second port;

providing the first clocked predecoded port address to a first word line driver comprising a first logic gate having a first input for receiving the first clocked predecoded port address, a second input for receiving a disable signal and an output to provide a first word line signal to the first write port;

providing the second clocked predecoded port address to a second word line driver comprising a second logic gate having an output coupled to the second input of the first logic gate for providing the disable signal and having an input for receiving the second clocked predecoded port address, the second word line driver coupled to provide a second word line signal to the second write port; and using the disable signal to selectively disable access to the first write port and establish a higher priority to access the second write port than the first write port.

16. The method of claim 15, further comprising implementing the first logic gate as a logic NAND and implementing the second logic gate as a logic NAND.

17. The method of claim 15, further comprising implementing the first logic gate as an AND-OR-INVERT logic function and implementing the second logic gate as an AND-OR-INVERT logic function.

* * * * *